(12) United States Patent
Renfro

(10) Patent No.: US 7,037,115 B2
(45) Date of Patent: May 2, 2006

(54) ATTACHING INTEGRATED CIRCUITS TO PRINTED CIRCUIT BOARDS

(75) Inventor: Tim A. Renfro, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/844,644

(22) Filed: May 13, 2004

(65) Prior Publication Data

US 2005/0255723 A1    Nov. 17, 2005

(51) Int. Cl.
*H01R 12/00* (2006.01)
(52) U.S. Cl. ............................. 439/71; 439/68; 439/751
(58) Field of Classification Search ............ 439/68–71, 439/140–141, 72–73, 751, 912; 324/761
See application file for complete search history.

(56) References Cited

U.S. PATENT DOCUMENTS

| | | | |
|---|---|---|---|
| 5,395,254 A * | 3/1995 | Mogi ........................... 439/70 |
| 5,518,410 A * | 5/1996 | Masami ........................ 439/71 |
| 5,791,914 A * | 8/1998 | Loranger et al. ............. 439/71 |
| 5,807,104 A * | 9/1998 | Ikeya et al. ................... 439/73 |
| 5,955,888 A * | 9/1999 | Frederickson et al. ....... 324/761 |
| 6,123,552 A * | 9/2000 | Sakata et al. ................ 439/71 |
| 6,220,870 B1 * | 4/2001 | Barabi et al. ................ 439/71 |
| 6,229,320 B1 * | 5/2001 | Haseyama et al. ........... 324/754 |
| 6,497,582 B1 * | 12/2002 | Hoffmeyer .................... 439/71 |
| 6,541,991 B1 * | 4/2003 | Hornchek et al. ........... 324/755 |
| 6,776,624 B1 * | 8/2004 | Suematsu ..................... 439/71 |
| 2004/0175966 A1 * | 9/2004 | Alger et al. .................. 439/68 |

\* cited by examiner

*Primary Examiner*—Michael C. Zarroli
(74) *Attorney, Agent, or Firm*—Trop, Pruner & Hu, P.C.

(57) ABSTRACT

A land grid array socket may receive an integrated circuit package for electrical connection thereto through lands on the integrated circuit package and spring contacts which extend upwardly to engage those lands from the socket. A protector plate may be situated over the spring contacts prior to the time at which the integrated circuit package is assembled onto the socket. As a result, the spring contacts on the socket may be prevented from damage prior to the time that they are engaged by the integrated circuit package.

8 Claims, 2 Drawing Sheets

ATTACHING INTEGRATED CIRCUITS TO PRINTED CIRCUIT BOARDS

BACKGROUND

This invention relates generally to attaching integrated circuits to printed circuit boards.

Integrated circuits may be attached to printed circuits boards, such as motherboards, to produce electrical devices such as processor-based systems. A variety of integrated circuits may be attached to the printed circuit board.

One way to attach integrated circuits to printed circuit boards is to use a land grid array connector or socket. The socket electrically connects to contacts on the printed circuit board. At the same time, on its upper side, the socket has spring contacts that electrically contact lands on the integrated circuit. Thus, when the integrated circuit is pressed onto the socket and the socket is appropriately attached to the printed circuit board, a large number of electrical connections can be made through the spring contacts and lands to corresponding contacts on the printed circuit board.

The spring contacts on the connector or socket are relatively easily damaged. A large number of such contacts must be provided in a relatively small space. As a result, the spring contacts are structurally easily deformed. If these contacts become plastically deformed, it is not infeasible to repair those contacts. Thus, damaged contacts may result in the failure of the part or the need to replace the socket.

Thus, there is a need for ways to reduce the amount of damage that occurs to spring contacts in land grid array sockets, especially damage that may occur before the integrated circuit is coupled to the socket.

DETAILED DESCRIPTION

Figure 1:
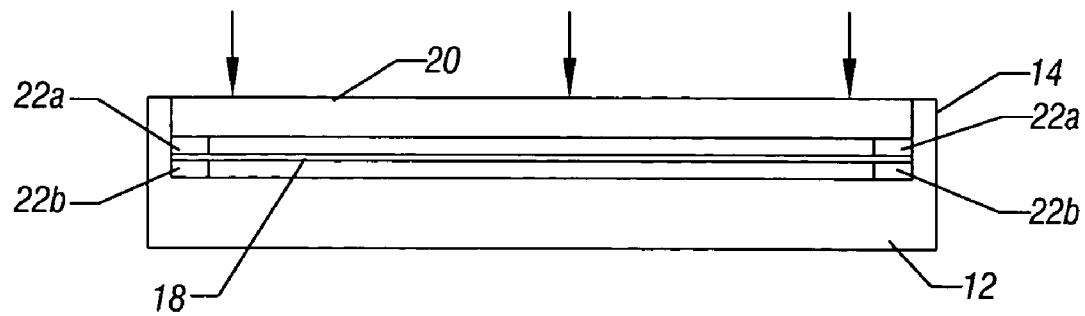
FIG. 1 is an enlarged, cross-sectional view in accordance with one embodiment of the present invention.

Referring to FIG. 1, a land grid array connector or socket 12 may connect on its lower surface to a printed circuit board such as a motherboard (not shown). On its body upper surface it may have a set of four upwardly extending guides 14 to guide the vertical placement of a land grid array integrated circuit package 20. The package 20 may have lands on its lower facing surface that are engaged by an array of springs on the upwardly facing surface of the socket 12.

The springs are protected, prior to placement of the integrated circuit package 20, by a protector plate 18 which has a large number of apertures formed in it. The apertures allow free upward movement through the plate 18 of the spring contacts on the upper surface of the socket 12. Thus, in one embodiment, the apertures may be shaped to correspond to the shape of the spring contacts. The plate 18 may be formed of an electrical insulator such as plastic.

However, prior to the placement of the integrated circuit package 20, the protector plate 18 may effectively float over the contacts of the socket 12. Initially, the contacts on the socket 12 may not, in some embodiments, extend through the apertures in the plate 18, but may reside beneath it. As a result, the spring contacts on the socket 12 may be protected from accidental contact and damage while they otherwise would have been exposed prior to placement of the integrated circuit package 20.

In some embodiments, the protector plate 18 may rest on top of a peripheral spring 22b. In one such embodiment, the spring 22b may extend around the edges of the socket 12, proximate to its upstanding guides 14. In other embodiments, the spring 22b may be a plurality of springs situated around the periphery of the socket 12. In some embodiments, the spring 22b may be formed of a gasket-like foam material which extends around the periphery of the socket 12 and spaces the protector plate 18 over the spring contacts of the socket 12. In another embodiment, the spring 22b may include spring biased pistons which are physically secured to the socket 12 at at least four locations. Those spring biased pistons are capable of vertical displacement, but may prevent side-to-side displacement of the plate 18 to the greatest possible extent to facilitate the penetration of the spring contacts through the protector plate 18.

In some embodiments, an additional spring 22a may be situated over the plate 18 and underneath the incoming integrated circuit package 20. However, the spring 22a may be dispensed with in some embodiments. The spring 22a may be similar to the spring 22b in some embodiments.

Thus, the integrated circuit package 20 may be inserted into the guides 14 of the socket 12 in the direction indicated by the arrows. Its insertion may be driven by an appropriate mechanical apparatus.

Figure 2:
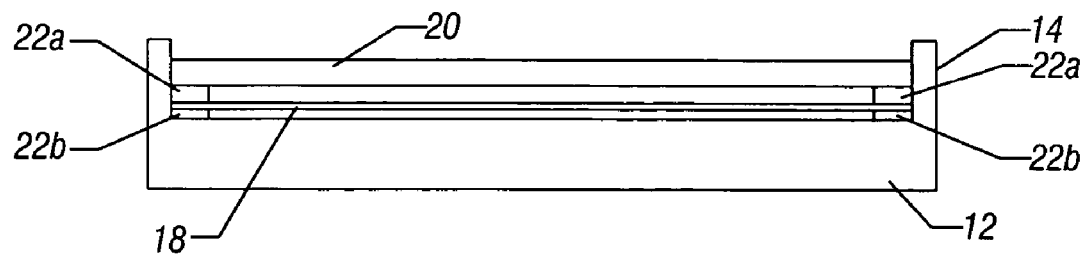
FIG. 2 is an enlarged, cross-sectional view corresponding to FIG. 1 at a subsequent stage in an assembly process in accordance with one embodiment of the present invention.

Thus, as shown in FIG. 2, the integrated circuit package 20 may be pressed downwardly into the socket 12 so as to depress and push downwardly the plate 18, allowing the spring contacts to extend through the protector plate 18 and make electrical contact to lands on the lower surface of the integrated circuit package 20. Thus, the spring 22b and the spring 22a, if present, may be compressed to allow electrical connection between the package 20 and the socket 12.

Figure 3:
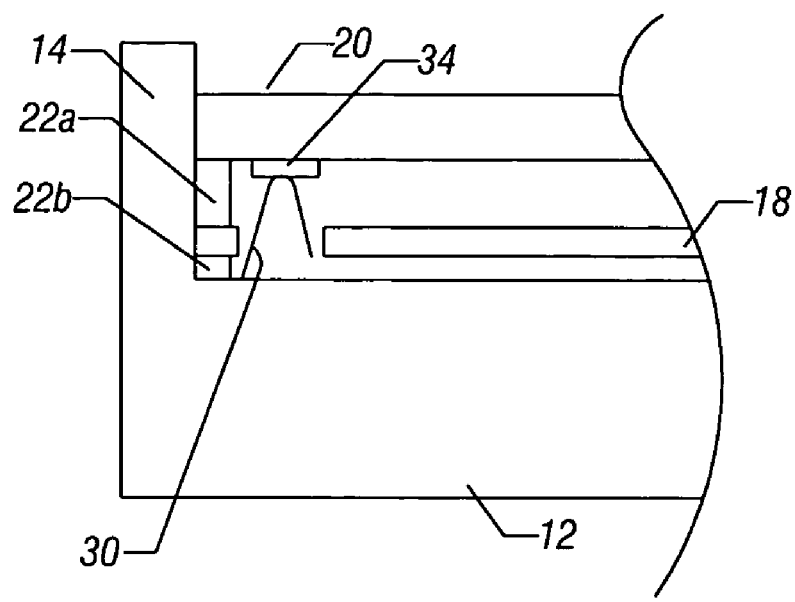
FIG. 3 is an enlarged, cross-sectional view of an end portion of the embodiment shown in FIG. 2 in accordance with one embodiment of the present invention.
Figure 4:
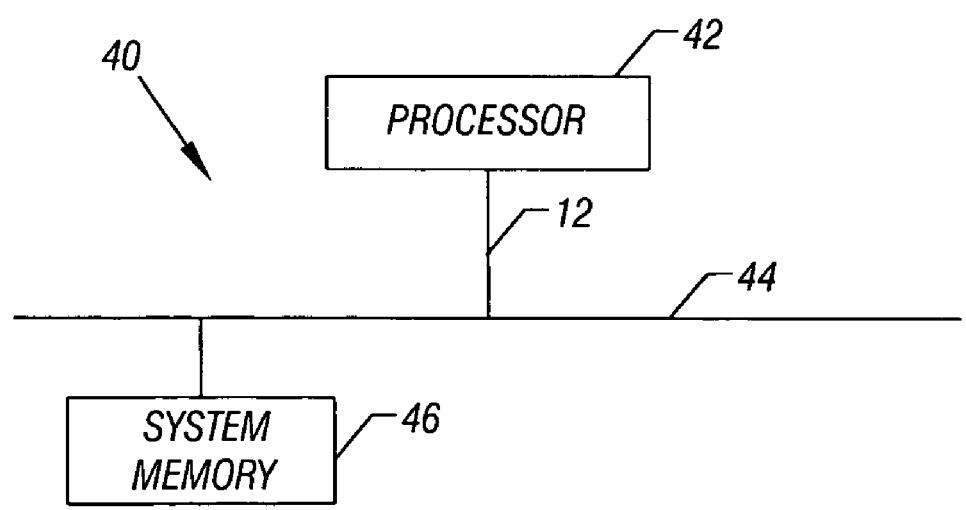
FIG. 4 is a system schematic depiction in accordance with one embodiment of the present invention.

Referring to FIG. 3, in one embodiment, a spring contact 30 of the socket 12 extends upwardly through an opening 32 in the plate 18 after the package 20 has been depressed downwardly towards the socket 12. As a result, the spring contact 30 makes an electrical connection to a land 34 on the integrated circuit package 20. Thus, the penetration of the spring contact 30 through the opening 32 allows an electrical connection to be made.

As shown in FIG. 3, the spring 22b has been compressed or depressed. To the extent it is desirable that the spring contact 30 extend significantly through the protector plate 18, the spring 22a may be utilized. For example, in embodiments where it is not necessary for the spring contact 30 to extend significantly through the aperture 32 in the protector plate 18, the spring 22a may be omitted.

The volume 26 between the plate 18 and the socket 12 may be compressed as a result of the insertion of the package 20. The volume 24 between the package 20 and the protection plate 18 may be non-existent or, in embodiments in which the spring 22a is provided, the spacing 24 may be maintained.

Thus, in some embodiments of the present invention, good electrical coupling may be achieved between the package 20 and the socket 12. At the same time, prior to package 20 insertion, the spring contacts 30 may be protected against damage by inadvertent contact. Thus, the exposed spring contacts 30 are protected prior to their ultimate protection by the overlying package 20.

The integrated circuit package 20 may implement the processor 42 in one embodiment of the present invention. The socket 12 may couple the processor 42 to the rest of the motherboard 40 and, particularly, to the bus 44 in one embodiment of the present invention. The system memory 46 may be implemented by volatile or non-volatile semiconductor memory in one embodiment of the present invention.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A packaged integrated circuit assembly comprising:
   a socket;
   an integrated circuit package having lands;
   spring contacts on said socket, said spring contacts engaged with lands on said package;
   a protector plate between said socket and said package, said plate including apertures and said contacts extending through said apertures; and
   a first spring between said socket and said plate and a second spring between said plate and said integrated circuit wherein said springs include foam.

2. The assembly of claim 1 wherein said plate is vertically reciprocable.

3. The assembly of claim 1 wherein said protector plate is upwardly spring biased.

4. The assembly of claim 3 wherein one of said springs is a spring biased piston.

5. The assembly of claim 1 wherein said socket includes guides to retain said package in alignment with said socket.

6. A system comprising:
   a motherboard including a processor, a semiconductor memory, and a bus coupled to said processor and said memory;
   a socket including spring contacts, said spring contacts to engage lands on said processor;
   a protector plate between said socket and said processor, said plate including apertures and said contacts extending through said apertures; and
   a first foam spring between said socket and said plate and a second foam spring between said plate and said processor.

7. The system of claim 6 wherein said plate is vertically reciprocable.

8. The system of claim 6 wherein said plate is spring biased.

* * * * *